United States Patent [19]
Kalnitsky et al.

[11] Patent Number: 6,078,211
[45] Date of Patent: Jun. 20, 2000

[54] SUBSTRATE BIASING CIRCUIT THAT UTILIZES A GATED DIODE TO SET THE BIAS ON THE SUBSTRATE

[75] Inventors: Alexander Kalnitsky, San Francisco; Pavel Poplevine, Foster City; Albert Bergemont, Palo Alto, all of Calif.

[73] Assignee: National Semiconductor Corporation, Santa Clara, Calif.

[21] Appl. No.: 09/173,096

[22] Filed: Oct. 14, 1998

[51] Int. Cl.[7] ................................................ H03K 3/01
[52] U.S. Cl. ............................ 327/534; 327/535; 327/564
[58] Field of Search .................................. 327/534, 535, 327/537, 564, 565, 566

[56] References Cited

U.S. PATENT DOCUMENTS

| | | | |
|---|---|---|---|
| 4,491,746 | 1/1985 | Koike | 327/534 |
| 4,791,317 | 12/1988 | Winnerl et al. | 327/198 |
| 5,394,026 | 2/1995 | Yu et al. | 327/536 |
| 5,587,596 | 12/1996 | Chi et al. | 257/223 |
| 5,608,243 | 3/1997 | Chi et al. | 257/249 |
| 5,610,549 | 3/1997 | Choi | 327/535 |
| 5,612,644 | 3/1997 | Runnas | 327/535 |
| 5,670,907 | 9/1997 | Gorecki et al. | 327/535 |
| 5,694,072 | 12/1997 | Hsiao et al. | 327/537 |
| 5,710,446 | 1/1998 | Chi et al. | 257/225 |
| 5,841,126 | 11/1998 | Fossum et al. | 250/208.1 |
| 5,952,872 | 9/1999 | Hur | 327/535 |

OTHER PUBLICATIONS

Dickinson, A. et al, TP 13.5: A 256×256 CMOS Active Pixel Image Sensor with Motion Detection, TP 13:5, *IEEE* International Solid–State Circuits Conference (1995) pp. 226–227.

Kawashima, H., et al. "A ¼ Inch Format 250K Pixel Amplified MOS Image Sensor Using CMOS Process," *IEEE*, 1993, pp. 575–578.

A. Kalnitsky, et al., "Experimental Investigation of N–MOS Inversion Layers in the Electric Quantum Limit," *Journal of Electronic Materials*, vol. 21, No. 3., pp. 367–372, (1992).

*Primary Examiner*—Tuan T. Lam
*Assistant Examiner*—An T. Luu
*Attorney, Agent, or Firm*—Limbach & Limbach L.L.P.

[57] ABSTRACT

A substrate biasing circuit utilizes a gated diode and a detection transistor to set the potential on a substrate to a desired substrate bias level. The potential on the substrate is set to the desired substrate bias level by applying a series of pulses to the gated diode. Each of the pulses applied to the gated diode causes a fixed amount of charge to be injected into the substrate. When the potential on the substrate has reached the desired substrate bias level, the pulses are insufficient to cause any further charge to be injected into the substrate. The detection transistor is used to determine when the potential is at the desired substrate bias level by biasing the transistor to output a current that corresponds to the potential on the substrate.

18 Claims, 2 Drawing Sheets

SUBSTRATE BIASING CIRCUIT THAT UTILIZES A GATED DIODE TO SET THE BIAS ON THE SUBSTRATE

RELATED APPLICATIONS

The present invention is related to application Ser. No. 09/173,276 for CMOS COMPATIBLE PIXEL CELL THAT UTILIZES A GATED DIODE TO RESET THE CELL by Alexander Kalnitsky et al., which is filed on an even date herewith.

BACKGROUND OF THE INVENTION

1. Field of the Invention

The present invention relates to a substrate biasing circuit and, more particularly, to a substrate biasing circuit that utilizes a gated diode to set the bias on the substrate.

2. Description of the Related Art

In integrated circuits, the substrate of the circuit is often separately biased to suppress noise, precisely control the threshold voltages of MOS transistors, and prevent latchup. A substrate biasing circuit is a circuit that sets and maintains a desired substrate bias level.

Although many variations have been disclosed, a substrate biasing circuit typically includes a charge pump, an oscillator that drives the charge pump, and a level detector that controls the oscillator in response to the voltage detected on the substrate.

SUMMARY OF THE INVENTION

The present invention provides a substrate biasing circuit that utilizes a gated diode which is formed in a floating well. The gated diode, for example, can pump down the potential on the floating well to a lower limit where the potential on the floating well can not be pumped down below the lower limit. By setting a desired substrate bias level to be equal to the lower limit, the floating well, once pumped down, can be held at the desired substrate bias level by pumping down the potential on the floating well whenever the potential is greater than the lower limit.

A substrate biasing circuit in accordance with the present invention, which is formed in a semiconductor material of a first conductivity type, includes a first well of a second conductivity type which is formed in the semiconductor material, and a second well of the first conductivity type which is formed in the first well.

The substrate biasing circuit also includes a gated diode which is formed in the second well, a cell diode which is connected between the gated diode and ground, and an oscillator which is connected to the gated diode.

The substrate biasing circuit of the present invention is operated by applying pulses to the gated diode. The pulses are sufficient to cause charge to flow into the second well when the potential on the second well is not equal to the desired substrate bias level, and insufficient to cause charge to flow through the cell diode when the potential on the second well is equal to the desired substrate bias level.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
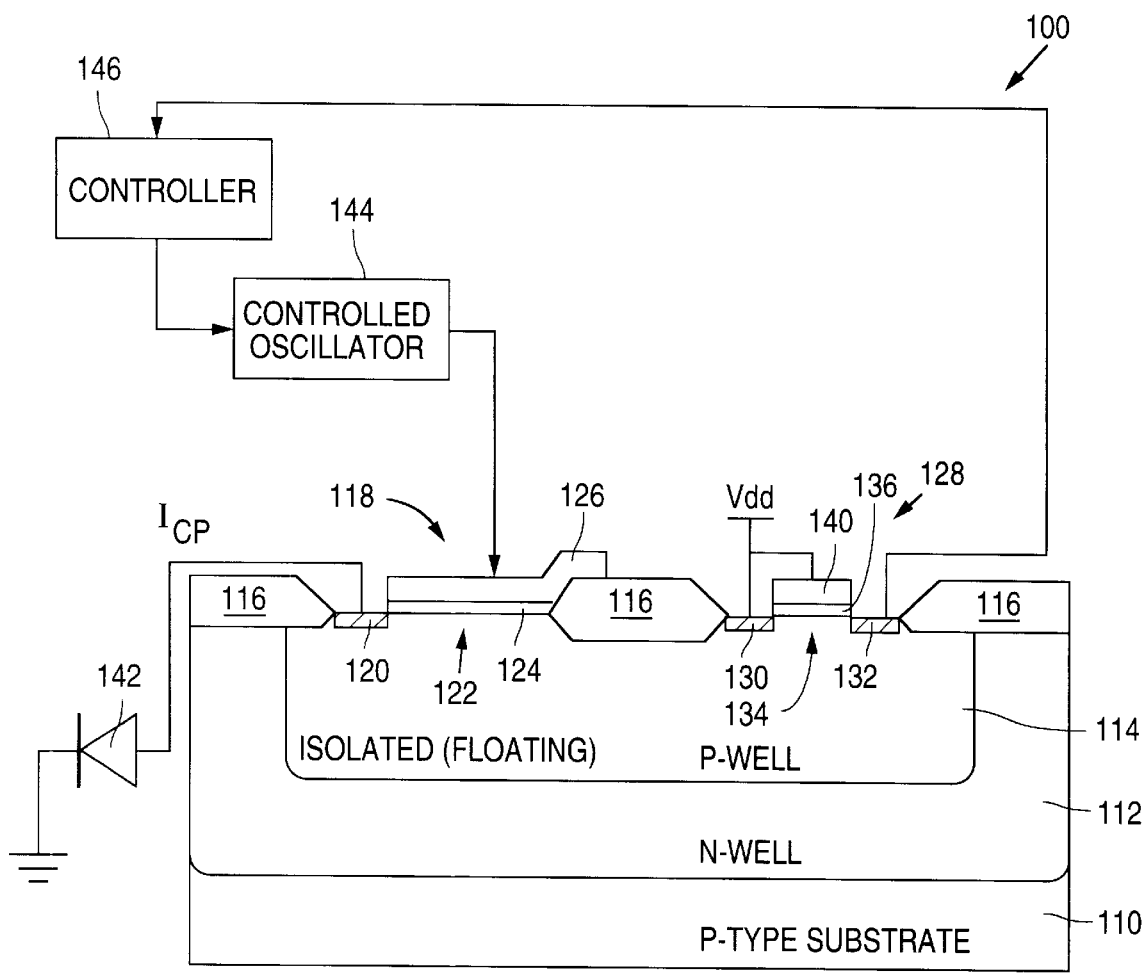
FIG. 1 is a cross-sectional and schematic drawing illustrating a substrate biasing circuit 100 in accordance with the present invention.

FIG. 1 shows a cross-sectional and schematic drawing that illustrates a substrate biasing circuit 100 in accordance with the present invention. As shown in FIG. 1, circuit 100, which is formed in a p-type material 110, such as a substrate, includes a n-well 112 which is formed in substrate 110, and a p-well 114 which is formed in n-well 112.

As further shown in FIG. 1, circuit 100 also includes a plurality of field oxide regions 116, a gated diode 118, and a detection transistor 128 which are each formed in p-well 114. Gated diode 118 includes a n+ diffusion region 120 which is formed in p-well 114, and an inversion region 122 which is defined in p-well 114 between an oxide region 116 and diffusion region 120. In addition, gated diode 118 also includes a layer of oxide 124 which is formed over inversion region 122, and a diode gate 126 which is formed on oxide layer 124 over inversion region 122.

Transistor 128, in turn, includes a n+ drain region 130 which is formed in p-well 114, a n+ source region 132 which is formed in p-well 114, and a channel region 134 which is defined in p-well 114 between drain and source regions 130 and 132. In addition, transistor 128 also includes a layer of gate oxide 136 which is formed over channel region 134, and a detection gate 140 which is formed over gate oxide layer 136.

Circuit 100 additionally includes a circuit diode 142 which is connected between diffusion region 120 and ground, an oscillator 144 which is connected to diode gate 126, and a controller 146 which is connected to transistor 128 and oscillator 146.

During the operation of circuit 100, n-well 112 is biased to ground, while p-well 114 is floated. When power is first applied to circuit 100, the p-well to n-well junction is at or near equilibrium. As a result, the initial potential on p-well 114 is at or near ground.

In operation, the initial potential on p-well 114 is lowered to a desired substrate bias level by applying a series of positive pulses to diode gate 126. Specifically, controller 146 commands oscillator 144 to output a series of positive pulses to gate 126. (Since the pulses are applied to a gate, the pulses may be generated by on-board charge pumps as the charge pumps do not need to sustain a large current flow).

When gate 126 is pulsed positive, a positive potential is capacitively coupled to the surface of p-well 114 which, in turn, lowers the potential barrier across the n+ diffusion region 120 to p-well 114 junction.

As a result, electrons flow from ground through diode 142 to n+ diffusion region 120 where the electrons are injected into p-well 114. The injected electrons migrate over to inversion region 122 where the electrons form an inversion layer. At the same time, mobile holes flow from p-well 114 through diffusion region 120 and diode 142 to ground.

When the voltage on gate 126 is returned to ground, the electrons in p-well 114 (except for the electrons that are within a diffusion length of the junction depletion region) are forced to recombine with the majority carriers (holes) in p-well 114 (diode 142 prevents the electrons from returning to ground).

The loss of holes due to recombination removes positive charge from p-well 114 which, in turn, causes the potential on p-well 114 to be lowered. Thus, each time diode gate 126 is pulsed, the potential on p-well 114 is lowered.

The lowest potential that p-well 114 can be lowered to is defined by the magnitude of the voltage applied to gate 126. As the potential on p-well 114 changes, the threshold voltage of diode 118 also changes. Raising the potential on p-well 114 lowers the threshold voltage of diode 118, while lowering the potential on p-well 114 raises the threshold voltage of diode 118. Thus, the potential on p-well 114 is lowered, and the threshold voltage of diode 118 is raised, each time a pulse is applied to gate 126.

Once the threshold voltage of diode 118 exceeds the magnitude of the voltage applied to gate 126, the voltage applied to gate 126 is unable to lower the potential barrier which, in turn, stops the process by preventing electrons from being injected into p-well 114.

As a result, once the threshold voltage exceeds the magnitude of the voltage applied to gate 126, the potential on p-well 114 hits a lower limit which can not be further lowered by applying additional pulses to gate 126. Thus, any pulses applied to gate 126 after the potential on p-well 114 has reached the lower limit have no significant effect.

In accordance with the present invention, the magnitudes of the voltage pulses applied to diode gate 126 are selected so that the lower limit, where substantially no charge flows into p-well 114 via diode 142 when the pulse is applied to gate 126, is equal to the desired substrate bias level. Thus, by selecting the magnitudes of the pulses, the potential on p-well 114 can be driven down to the desired substrate bias level without lowering the potential beyond the desired level.

Although oscillator 144 may be allowed to run continuously (in which case transistor 128 and controller 146 are not required), it may be desirable to turn oscillator 144 off, or change the frequency of oscillator 144, when the potential on p-well 114 has been driven down to the lower limit or desired substrate bias level. In the present invention, controller 146 determines when the potential on p-well 114 has reached the lower limit or desired substrate bias level by sensing the current that flows out of source region 132.

In further accordance with the present invention, a bias voltage Vdd, which is applied to drain region 130 and gate 140, is set to a voltage level which allows substantially no current to flow out of source region 132 when the potential on p-well 114 is equal to the desired substrate bias level, but which allows current to flow out if the potential on p-well 114 is raised above the desired substrate bias level.

(The bias voltage Vdd may alternately be set to allow any level of current flow when the potential on p-well 114 is equal to the desired substrate bias level as long as the magnitude of the current can increase when the potential on p-well 114 increases).

As with diode 118, decreasing the potential on p-well 114 increases the threshold voltage of transistor 128, while increasing the potential on p-well 114 decreases the threshold voltage of transistor 128. Thus, raising the potential on p-well 114 above the desired substrate bias level lowers the threshold voltage of transistor 128 which, in turn, allows a current to flow out of source region 132.

On the other hand, when the potential on p-well 114 is at the desired substrate bias level, the threshold voltage of transistor 128 is raised to the point where current no longer flows out of source region 132.

After controller 146 has determined that the potential on p-well 114 is equal to the desired substrate bias level by sensing the current flowing out of source region 132, controller 144 may command oscillator 146 to change the frequency and/or amplitude of the pulses, or to stop outputting the pulses.

In a realistic circuit implementation, once the potential on p-well 114 has been lowered to the desired substrate bias level, the potential will gradually begin to rise due to thermally-generated electron-hole pairs.

The thermally-generated holes that are formed within a diffusion length of the junction depletion region are swept into p-well 114 by the junction electric field where in the increased number of holes increases the potential on p-well 114. Thus, once the desired substrate bias level has been reached, additional negative charge need only be injected into p-well 114 to neutralize the effects of the thermally-generated holes.

If controller 146 commands oscillator 144 to change the frequency and/or amplitude of the pulses, then the change must be sufficient to allow negative charge to be injected into p-well 114 at a rate which is equal to or greater than the rate that thermally-generated holes are being added to p-well 114. If controller 146 commands oscillator 144 to stop outputting pulses when no current is present, controller 146 also commands oscillator 144 to begin again outputting pulses when a current is detected.

Figure 2:
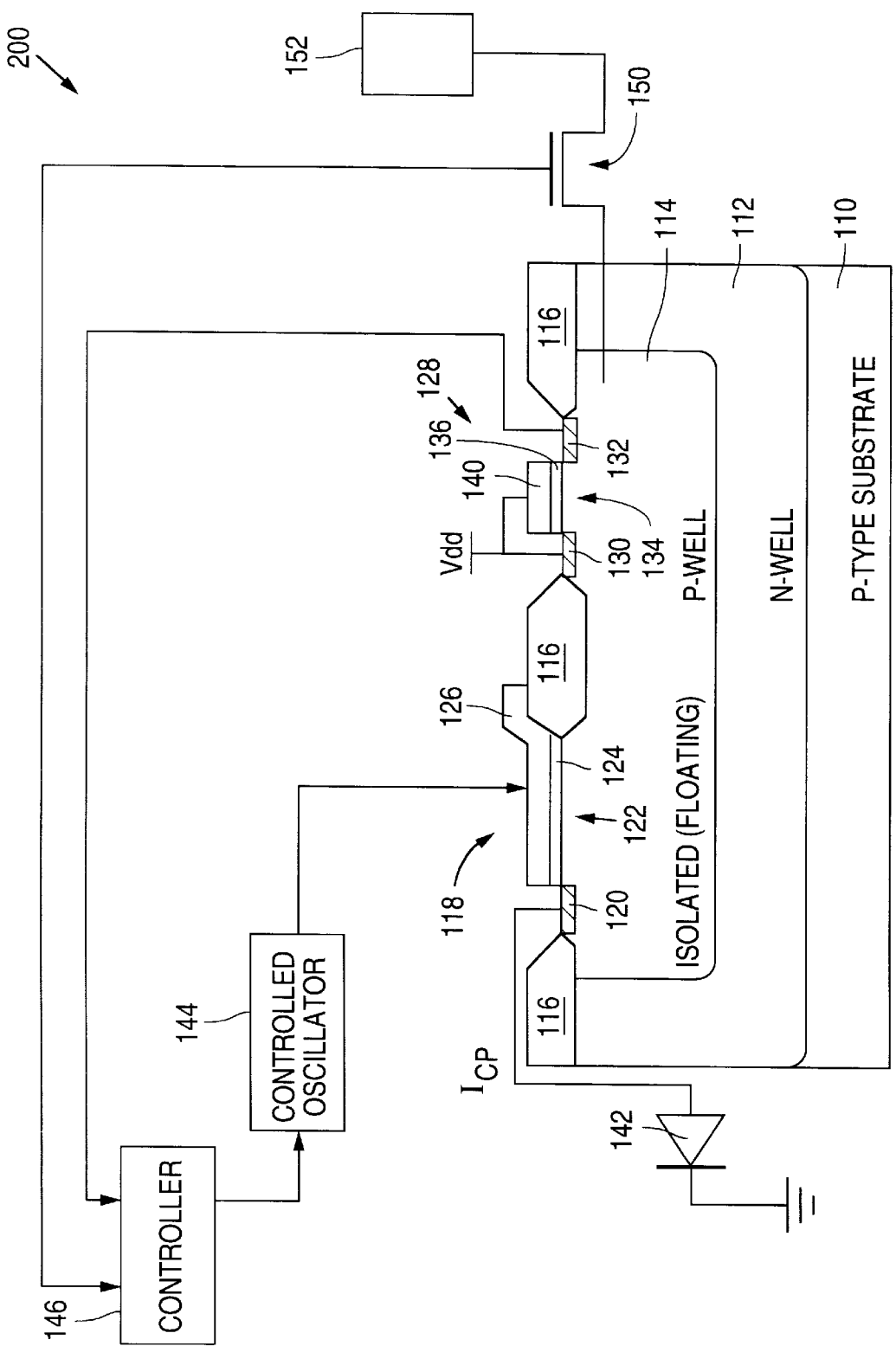
FIG. 2 is a cross-sectional and schematic drawing illustrating a substrate biasing circuit 200 in accordance with an alternate embodiment the present invention.

FIG. 2 shows a cross-sectional and schematic drawing that illustrates a substrate bias generator circuit 200 in accordance with an alternate embodiment of the present invention. Circuit 200 and circuit 100 are similar and, as a result, utilize the same reference numerals to designate the structures which are common to both circuits.

As shown in FIG. 2, circuit 200 differs from circuit 100 in that circuit 200 also includes a reset transistor 150 which is used to gate p-well 114 to a voltage source 152. The advantage of utilizing reset transistor 150 is that the potential on p-well 114 can be set to a known potential. For example, controller 146 can reset the potential on p-well 114 to ground by pulsing the gate of reset transistor 150 when voltage source 152 is ground.

As another example, controller 146 can set the potential on p-well 114 to a level which is just greater than the desired substrate bias level by pulsing the gate of reset transistor 150 when voltage source 152 is a negative voltage just greater than the desired substrate bias level. The advantage of using a negative voltage is that fewer pulses need be applied to diode gate 126 to bring the potential on p-well 114 down to the desired substrate bias level.

In addition, if voltage source 152 is configured to provide multiple voltages, circuit 200 can be used to provide multiple substrate bias levels by correlating the magnitudes of the currents flowing out of source region 132 with the additional bias levels.

For example, when two desired bias levels, a first bias level and a second bias level, are to be used, the first bias level is set to be equal to the lower limit. Thus, the potential on p-well 114 can be set to the first bias level by setting voltage source 152 to a first negative voltage which is just greater than the first bias level, pulsing the gate of reset transistor 150, and then applying a series of pulses to diode gate 126 to bring the potential on p-well 114 down to the first bias level.

The second bias level, in turn, is set to a potential which is greater than the lower limit. The current flowing out of source region 132 when the potential on p-well 114 is equal to the second bias level must be determined.

Once determined, the potential on p-well 114 can be set to the second bias level by setting voltage source 152 to a second negative voltage which is just greater than the second bias level, pulsing the gate of reset transistor 150, and then applying a series of pulses to diode gate 126 to bring the potential on p-well 114 down to the second bias level.

Controller 146 determines that the second bias level has been reached when the current flowing out of source region 132 is equal to or less than the current level that corresponds to the second bias level. In this case, controller 146 can not allow oscillator 144 to continue outputting pulses when the second bias level has been reached.

If controller 146 commands oscillator 144 to stop, controller 146 also commands oscillator 146 to output one or more pulses when the current flowing out of source region 132 exceeds the current level that corresponds to the second bias level.

The negative charge Qi injected into p-well 114 during a pulse (the steady-state charge in the inversion layer) is given by EQ. 1 as:

$$Qi = Cox * Area * (Vg - Vt) \qquad \text{EQ. 1}$$

where Cox is the gate oxide capacitance per unit area, Area is the diode gate area, Vg is the diode gate voltage pulse amplitude, and Vt is the threshold voltage of gated diode 118.

As shown in EQ. 1, a fixed amount of charge Qi is injected into p-well 114 with each pulse. Thus, when controller 146 determines that the magnitude of the current flowing out of source region 132 exceeds the current level that corresponds with the second bias level, and commands oscillator 144 to output one or more pulses, only a very small number of times will the fixed-amount of injected negative charge exactly compensate for the increased positive charge that results from the thermally-generated holes. Thus, in many cases, the fixed-amount of injected charge will cause the potential on p-well 114 to be less than the second bias level. The amount of charge that is injected with each pulse, however, can be varied by varying the elements of EQ. 1.

In addition, rather than using reset transistor 150, the potential on p-well 114 can also be raised by relying on the thermally-generated holes. Thus, the potential on p-well 114 may be reset to ground or raised to a second bias level by controller 146 simply monitoring the magnitude of the current flowing out of source region 132, and only commanding oscillator 144 to output pulses when the magnitude of the current exceeds the current level that corresponds with ground or the second bias level.

The potential on p-well 114 may also be reset to ground or raised to a second bias level by using reset transistor 150 to set a potential on p-well 114 which is less than ground or the second bias level, and then relying on the thermally-generated holes to raise the potential to ground or the second bias level.

When a series of positive pulses are used, the above-described process is repeated for each positive pulse which gives rise to a charge pumping current Icp which is given by EQ. 2 as:

$$Icp = f * Qi \qquad \text{EQ. 2}$$

where f is the frequency of the series of positive pulses. The linear relationship between the frequency f and the charge pumping current Icp exists if the frequency f is sufficiently low for effective complete recombination of charge Qi to occur between pulse applications. The linear relationship holds up to frequencies of several megahertz at room temperature.

For a given amplitude of the pulsed signal, the charge pumping current Icp will increase with increasing temperature. In addition, the linear relationship will be extended due to enhanced charge recombination that occurs with increasing temperature.

The desired magnitude of the charge injection Qi per pulse is achieved by appropriately sizing inversion region 122 (including gate 126), and selecting the amplitude, frequency, and duty cycle of the pulse signal.

Figure 3:
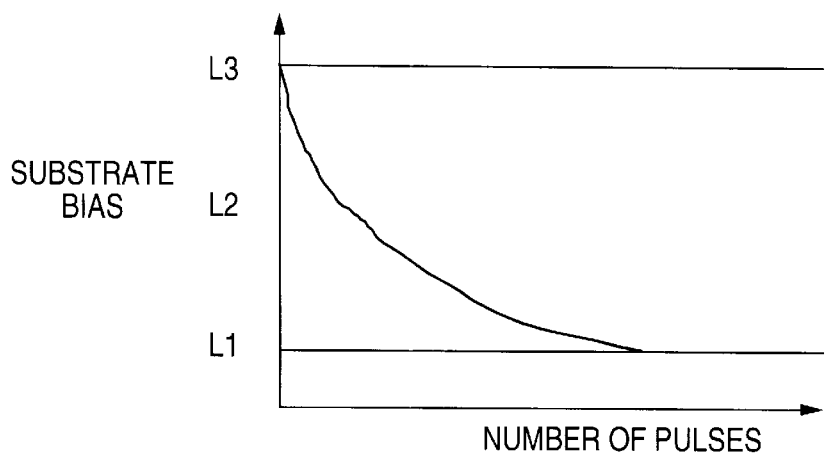
FIG. 3 is a graph illustrating the number of pulses versus the substrate potential in accordance with the present invention.

The negative charge Qi injected into p-well 114 is illustrated in FIG. 3. As shown in FIG. 3, more pulses are required to reduce the potential on p-well 114 from an intermediate level L2 to a lower limit L1 than are required to reduce the potential from a maximum limit L3 to the intermediate level L2. (The maximum limit L3 is defined as the potential where the p-well 114 to n-well 112 junction becomes forward biased).

The absolute value of the maximum lower limit that can be placed on p-well 114 is approximately equivalent to a back bias voltage Vbb, and can be estimated using the following equations:

$$V_t = V_{to} + k * SQRT(|Vbb|) \qquad \text{EQ. 3}$$

$$V_g - V_t = V_g - V_{to} - k \, (Vbb) \wedge 0.5 = 0 \qquad \text{EQ. 4}$$

$$Vbb = (1/k * [V_g - V_{to}]) \wedge 2 \qquad \text{EQ. 5}$$

where $V_t$ is the threshold voltage of the gated diode, $V_{to}$ is the threshold voltage at zero volts back bias, k is the back bias coefficient, and $V_g$ is the diode gate voltage.

Thus, EQ. 5 suggests that in modern MOS technologies, where k is less than one and $V_{to}$ is approximately 0.4–0.7V, the absolute value of the maximum lower limit of the potential on p-well 114 may be as high as or in excess of the power supply voltage.

It should be understood that various alternatives to the embodiment of the invention described herein may be employed in practicing the invention. For example, in addition to using a p-well which is fabricated in an isolating n-well which, in turn, is formed in a p-substrate, the p-well can also be formed in a n-substrate.

In addition, a n-well can be formed in a p-substrate, or in an isolating p-well which, in turn, is formed in a n-substrate. Further, an NMOS gated diode or a PMOS gated diode can be formed in a silicon island that is completely surrounded by a dielectric (e.g., SOI technology).

Thus, it is intended that the following claims define the scope of the invention and that methods and structures within the scope of these claims and their equivalents be covered thereby.

What is claimed is:

1. A substrate biasing circuit formed in a semiconductor material of a first conductivity type, the circuit comprising:
   a first well of a second conductivity type formed in the semiconductor material;
   a second well of the first conductivity type formed in the first well;
   a gated diode formed in the second well;
   a cell diode connected between the gated diode and ground; and
   an oscillator connected to the gated diode.

2. The biasing circuit of claim 1 and further comprising:
   a detection transistor formed in the second well, the detection transistor being spaced apart from the gated diode; and
   a controller connected to the oscillator and the detection transistor.

3. The biasing circuit of claim 2 and further comprising a reset transistor connected to the second well and the controller.

4. The biasing circuit of claim 1 wherein the gated diode includes:
   a diffusion region of the second conductivity type formed in the second well;
   an inversion region defined in the second well, the inversion region adjoining the diffusion region;
   a layer of oxide formed over the inversion region; and
   a diode gate formed on the layer of oxide layer.

5. The biasing circuit of claim 2 wherein the detection transistor includes:
   spaced-apart source and drain regions formed in the second well, the source and drain regions being spaced apart from the diffusion region and the inversion region;
   a channel region defined in the second well between the source and drain regions;
   a layer of gate oxide formed over the channel region; and
   a detection gate formed on the layer of gate oxide over the channel region.

6. The biasing circuit of claim 4 wherein the oscillator is connected to the diode gate of the gated diode.

7. The biasing circuit of claim 4 wherein the cell diode is connected between the diffusion region and ground.

8. The biasing circuit of claim 2 wherein the oscillator outputs a series of pulses when commanded by the controller, and stops outputting the pulses when commanded by the controller.

9. A method for biasing a semiconductor material to a desired substrate bias level from an initial level with a substrate biasing circuit, the circuit comprising:
   a first well of a second conductivity type which is formed in a semiconductor material of a first conductivity type;
   a second well of the first conductivity type formed in the first well;
   a gated diode formed in the second well;
   a cell diode connected between the gated diode and ground; and
   an oscillator connected to the gated diode;
   the method comprising the step of applying pulses to the gated diode, the pulses being insufficient to cause charge to flow through the cell diode when the potential on the second well is equal to the desired substrate bias level.

10. The method of claim 9 wherein the biasing circuit further includes:
    a detection transistor formed in the second well, the detection transistor being spaced apart from the gated diode; and
    a controller connected to the oscillator and the detection transistor.

11. The method of claim 10 and further comprising the step of biasing the detection transistor to output a current when the potential on the second well is different from the desired substrate bias level, and prevent the current from being output from the detection transistor when the potential on the second well is equal to the desired substrate bias level.

12. The method of claim 11 and further comprising the step of stopping the oscillator from outputting pulses when no current is output from the detection transistor.

13. The method of claim 10 and further comprising the step of biasing the detection transistor to output a first current when the potential on the second well is equal to the desired substrate bias level, and a different current when the current from being output when the potential on the second well is different from the desired substrate bias level.

14. The method of claim 10 and further comprising a reset transistor connected to the second well and the controller.

15. The method of claim 14 and further comprising the steps of pulsing on reset transistor prior to the step of applying pulses to the gated diode.

16. The method of claim 10 wherein a current having a magnitude substantially equal to a first level flows from the detection transistor when the potential on the second well is at the desired substrate bias level.

17. The method of claim 16 and further comprising the step of commanding the oscillator to output pulses when the magnitude of the current changes from the first level, and commanding the oscillator to stop outputting pulses when the magnitude of the current is substantially equal to the first level.

18. The method of claim 17 wherein the first level is substantially zero.

\* \* \* \* \*